United States Patent [19]

Chaprnka

[11] 3,991,301
[45] Nov. 9, 1976

[54] LOGARITHMIC FREQUENCY TO VOLTAGE CONVERTER

[75] Inventor: Anthony G. Chaprnka, Cockeysville, Md.

[73] Assignee: Westinghouse Electric Corporation, Pittsburgh, Pa.

[22] Filed: May 29, 1975

[21] Appl. No.: 582,016

[52] U.S. Cl. .......................... 235/150.53; 235/152; 328/145
[51] Int. Cl.² .................................. G06F 15/34
[58] Field of Search ...... 235/197, 152, 156, 150.53, 235/92 CC, 150.3; 328/145; 324/132; 307/228, 229, 230

[56] References Cited
UNITED STATES PATENTS

| | | |
|---|---|---|
| 3,426,184 | 2/1969 | Riseman .......................... 235/156 X |
| 3,579,127 | 5/1971 | Thomas ............................... 328/145 |
| 3,698,631 | 10/1972 | Drechsler ........................ 235/156 X |
| 3,866,024 | 2/1975 | Williams .......................... 235/92 CC |
| 3,878,383 | 4/1975 | Uchida ............................. 235/197 X |

*Primary Examiner*—Joseph F. Ruggiero
*Attorney, Agent, or Firm*—M. P. Lynch

[57] ABSTRACT

A clock driven digital pattern generator responds to input pulses by generating a digital pattern output corresponding to a predetermined geometric sequence, and a digital to analog converter converts the digital pattern into an analog output signal which is a logarithmic function of the frequency of the input pulses.

8 Claims, 5 Drawing Figures

LOGARITHMIC FREQUENCY TO VOLTAGE CONVERTER

BACKGROUND OF THE INVENTION

Typical techniques for developing a logarithmic frequency to voltage converter include networks consisting of diodes, transistors, capacitors, and resistors having close tolerances and matching characteristics. The requirement for discrete circuit components in the prior art logarithmic frequency to voltage converters raises significant problems in temperature compensation. Further, the requirement for matched resistor and capacitor values adversely effects the linearity of prior art logarithmic frequency to voltage converters due to the drift problems encountered with the discrete circuit components.

SUMMARY OF THE INVENTION

There is described herein with reference to the accompanying drawings a digital technique for providing logarithmic frequency to voltage conversion exhibiting log conformance characteristics superior to that realized from conventional discrete analog circuitry. The disclosed technique uses digital timing to replace the traditional function of discrete capacitors to perform log conversion. The digital technique disclosed herein lends itself to miniaturization and hybrid designs using COS/MOS chips, chip capacitors and thick or thin film resistor networks which are easily implemented since the resistors are easily matched and the capacitor tolerances are no longer important.

In a typical embodiment of the invention, a digital frequency to voltage converter for developing an analog output signal which is a logarithmic function of the frequency of input pulses consists of a clock driven ripple counter having a plurality of outputs wherein the ripple counter is either set or reset in response to randomly applied input pulses. A latching circuit is connected to each stage of the ripple counter and responds to the first occurrence of an output signal from the stage by changing the output voltage of the latching circuit from a first value to a second value. The output voltage levels of the latching circuits produced by the clock pulses applied to the binary ripple counter between input pulses represents a digital pattern developed in accordance with the geometric timing sequence of the binary ripple counter. A digital to analog converter, typically a resistor network, is connected to the outputs of the latching circuits with the digital to analog converter developing an analog output signal the average of which is a logarithmic function of the frequency of the input signals.

The use of digital techniques in a logarithmic frequency to voltage converter is discussed in the article, "An Accurate Logarithmic Ratemeter for Random Pulses," by H. J. Fiaser which appeared in IEEE Transactions on Nuclear Science, Vol. Ns-21, October 1974 and which is incorporated herein by reference.

DESCRIPTION OF THE DRAWINGS

The invention will become more readily apparent from the following exemplary description in connection with the accompanying drawings.

DESCRIPTION OF THE PREFERRED EMBODIMENT

Figure 1:
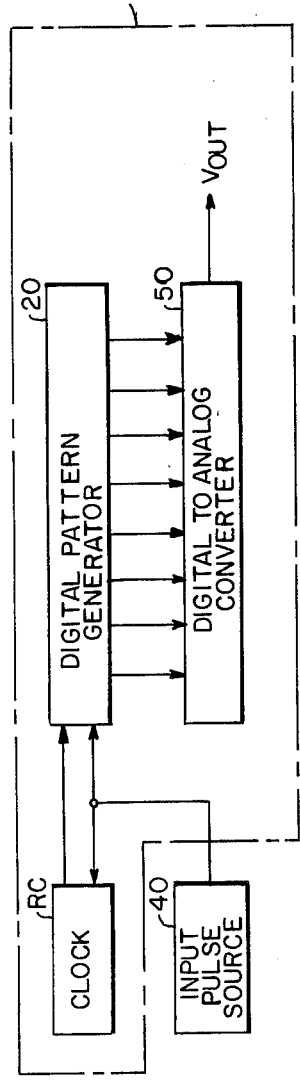
FIG. 1 is a basic block diagram illustration of an embodiment of the invention.

Referring to FIG. 1 there is illustrated in basic block diagram format a digital logarithmic frequency to voltage converter 10 including a digital pattern generator 20 driven by a reference clock source RC. The digital pattern generator responds to the clock pulses from the referenced clock RC by developing a digital output pattern corresponding to a predetermined geometric sequence. Input pulses from an input pulse source 40 function to recycle the digital pattern generator such that the digital output pattern from the digital pattern generator 20 is a function of the frequency of the input pulses. The digital to analog converter 50 converts the various digital output patterns produced by the digital pattern generator 20 in response to the input pulses from input pulse source 40 by developing an analog output voltage $V_{out}$ which is a logarithmic representation of the frequency of the input pulses applied to the digital pattern generator 20. The input pulse source 40 is representative of any circuit, transducer, or system which generates a pulse frequency output representation of a condition or parameter. The input pulses by design occur at a frequency less than the frequency of the clock pulses.

Figure 2:
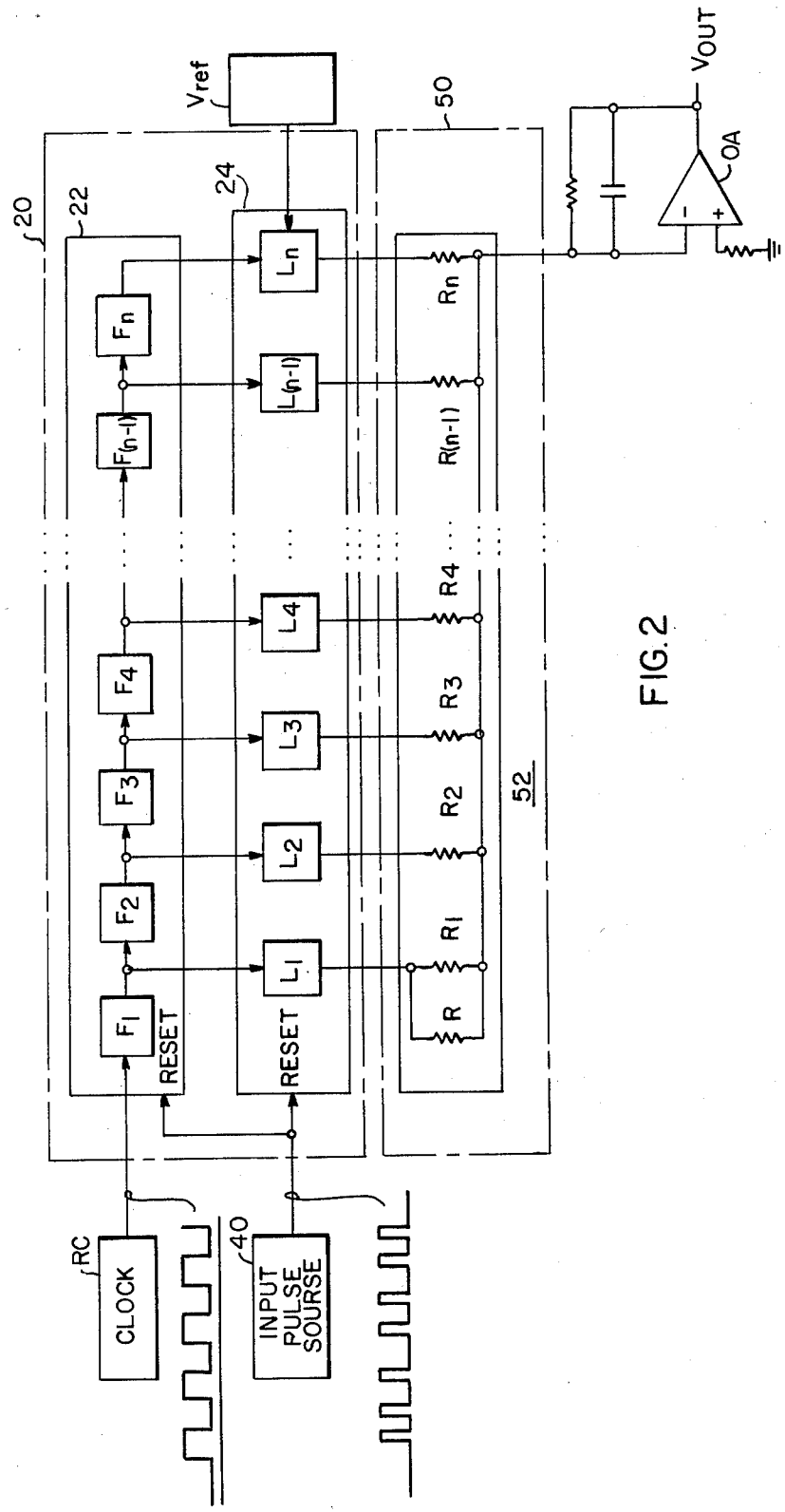
FIG. 2 is a detailed schematic illustration of a typical implementation of the embodiment of FIG. 1.

A typical implementation of the digital pattern generator 20 and the digital to analog 50 is illustrated in FIG. 2. The digital pattern generator 20 is depicted as consisting of a multi-stage ripple counter or more specifically as an n bit binary ripple counter 22 having a plurality of flip-flop stages $F1$-$F_n$ and a network of latching circuits 24 having a plurality of latching circuits $L1$-$L_n$ respectively connected to the output of the stages of the ripple counter 22. The digital to analog converter circuit 50 is implemented through the use of a resistor summing network 52 comprised of resistors $R1$-$R_n$ which are connected to the outputs of the latching circuits $L_1$-$L_n$ respectively.

A change in the output state of a counter stage of ripple counter 22 causes the output voltage level from the corresponding latch circuit to change from a predetermined voltage level established by the input reference voltage $V_{ref}$ to a second predetermined voltage level such that the current flow through the resistor and the resistor summing network 52 associated with the latching circuit will change. The output of the resistor summing network 52 will reflect the pattern of changes of state of the respective latching circuits as controlled by the geometric sequence of outputs developed by the binary ripple counter 22. The reference clock RC supplies pulses at a constant pulse rate to the input of the binary ripple counter 22 causing the flip-flop stages $F1$-$F_n$ to change state in accordance with the binary count rate. For instance, flip-flop F1 changes state in response to the first reference clock pulse, flip-flop F2 changes state in response to the second clock pulse, flip-flop F3 changes state in response to the fourth clock pulse, flip flop F4 changes state in response to the eighth clock pulse, etc.

Figure 3:
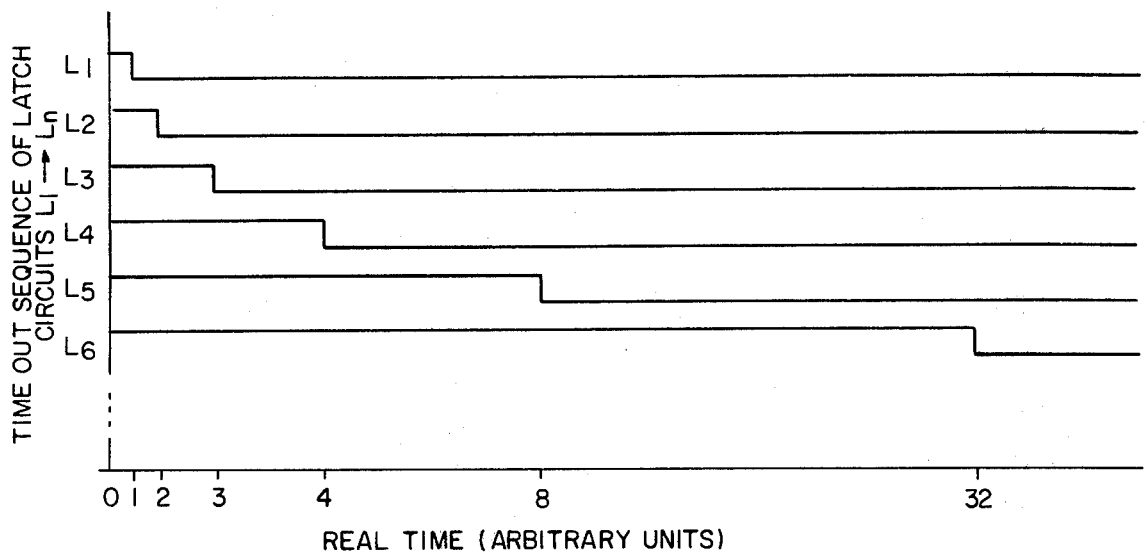
FIGS. 3 and 4 are graphical illustrations of the operation of the embodiment of FIG. 2.
Figure 4:
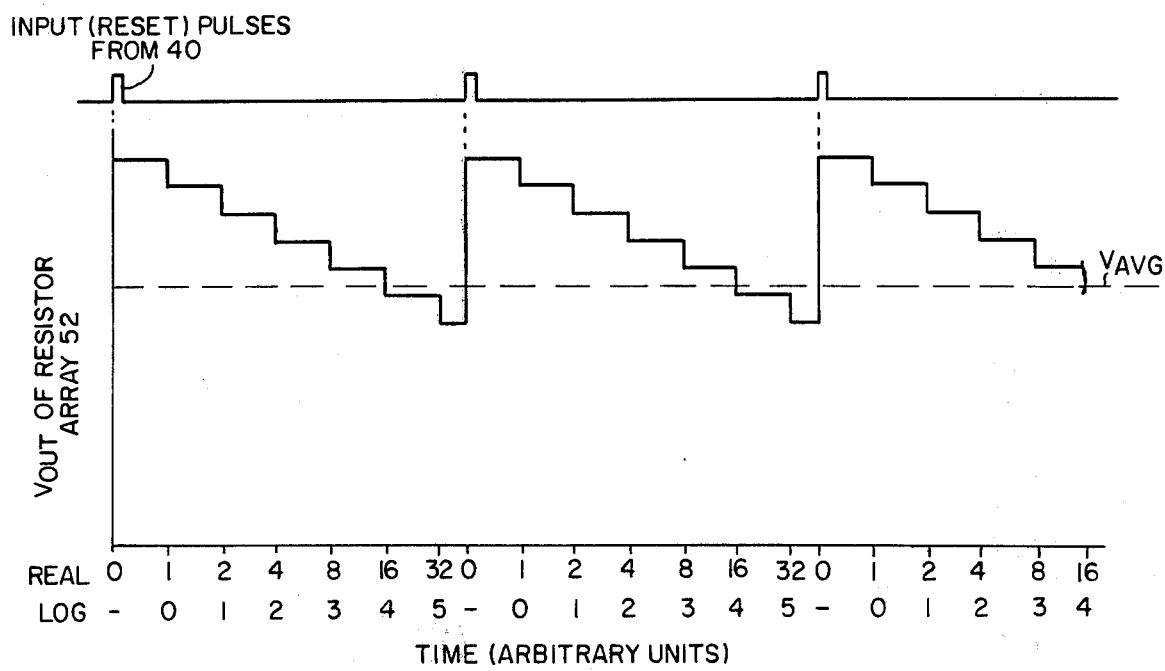

Assuming, for purposes of discussion, that prior to the initiation of clock pulses from the reference clock RC, that the reference voltage $V_{ref}$ supplied to the latching circuit 24 establishes the output of the respective latching circuits at a voltage $V_{high}$. The latching circuit, which can be typically implemented through the use of commercially available latching circuits, will switch from $V_{high}$ to $V_{low}$ in response to an output from the corresponding stage of the ripple counter 22 and will remain at $V_{low}$ until a reset signal is applied to the latching circuit to re-establish the output at $V_{high}$. The time out sequence of the latching circuit $L1-Ll_n$ in response to a continuous input of clock pulses from the reference clock circuit RC generates a digital pattern in accordance with the binary geometric sequence developed by the binary ripple counter 22. This time out sequence is illustrated in real time in FIG. 3 and in log time in FIG. 4. The time out sequence of the latching circuits $L1-L_n$ produced by the binary count output of the ripple counter 22 in response to the clock pulses RC follows the geometric sequence represented in FIGS. 3 and 4 until a pulse is transmitted by the input pulse source 40 which functions to reset the stages of the binary ripple counter 22 and reset the latching circuits of latching network 24 to return all the outputs of the latching circuits to a voltage $V_{high}$. The linear staircase waveform illustrated in FIG. 4 corresponds to the output of the summing resistor network 52 which is supplied to the input of the operational amplifier OA which in turn develops the analog output voltage $V_{out}$. While the schematic illustration of FIG. 2 depicts the output of the latching circuits going low, they could be initially established at $V_{low}$ such that the time out sequence of the latching circuit in response to the clocking of the binary ripple counter 22 would produce an increasing staircase output waveform from the summing resistor network 52 instead of the decreasing staircase waveform illustrated in FIG. 4. While the staircase waveforms illustrated in FIG. 4 correspond to an initial maximum count value in the latching circuit which decreases in time, the frequency of the input pulses from the input pulse source 40 will determine the number of latching circuits actuated before a subsequent input pulse resets the binary ripple counter 22 and the latching network 24.

While a binary ripple counter has been selected for the purposes of describing a technique for developing a digital pattern corresponding to the geometric sequence of a binary count sequence, it is apparent that circuitry capable of generating a geometric sequence other than a binary sequence may be substituted for the ripple counter 22. Furthermore, alternate stages of flip-flops of the binary counter 22 may be used instead of every stage as a cost/complexity vs. accuracy tradeoff. Numerous arbitrary functions and geometric sequences can be generated by changing the binary counter output decoding and/or resistor network.

The output voltage developed by the operational amplifier OA in response to the summing resistor network 52 can be represented as follows:

$$V_{out} = k \log (f_{in}/f_{ref}),$$

where $f_{in}$ corresponds to the frequency of the input pulses from the input pulse source 40, and $f_{ref}$ is the frequency of the clock pulses from the referenced clock RC divided by the number of stages in the ripple counter 22.

Figure 5:
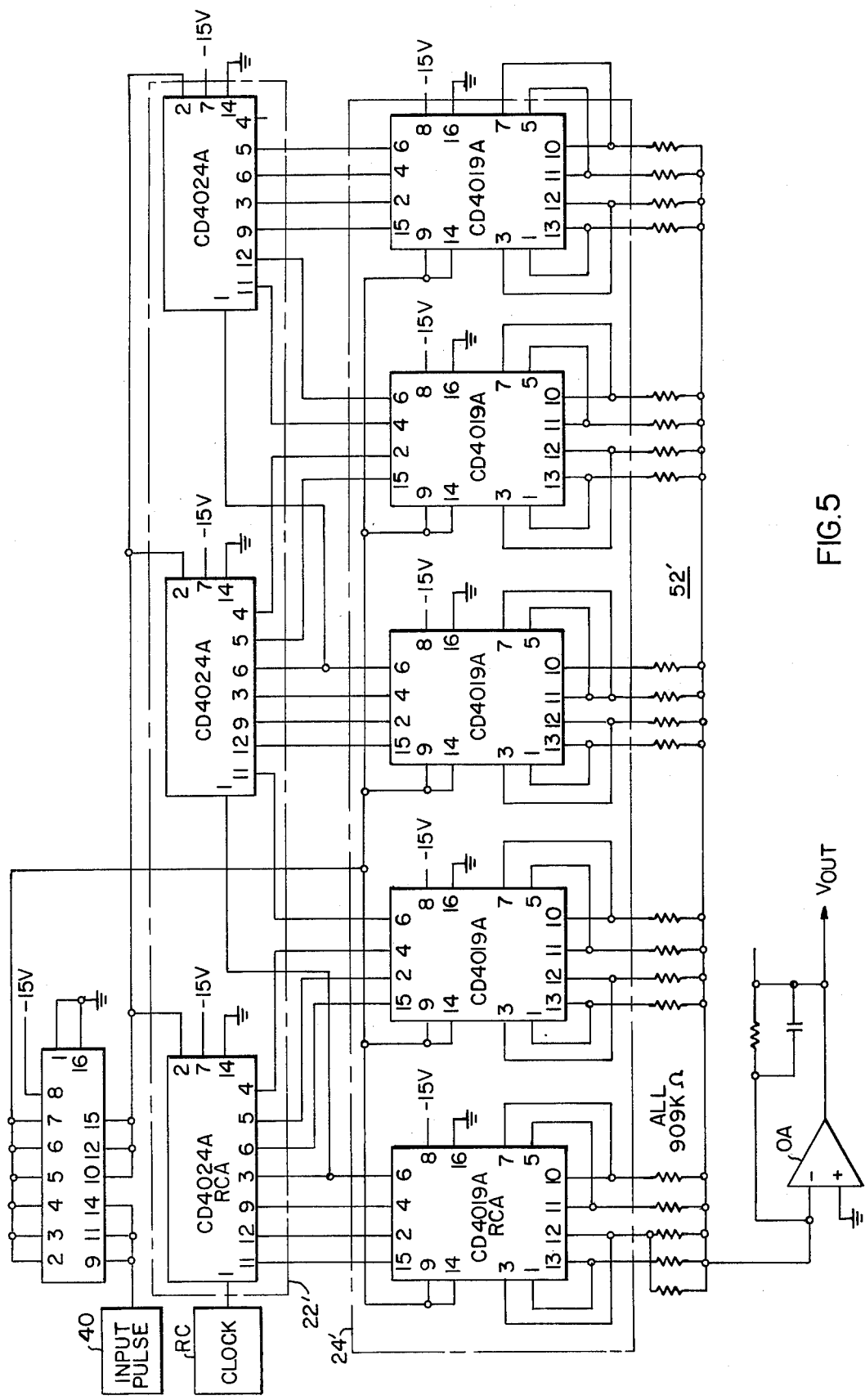
FIG. 5 is a schematic illustration of the embodiment of FIG. 2 utilizing commercially available integrated circuits.

There is illustrated in FIG. 5 schematic representation of an interconnection of RCA integrated circuits to satisfy the function of the 20 bit binary ripple counter 22 and the latching network 24 of FIG. 2. The binary counter 22' of FIG. 5 consists of three counter stages represented by RCA integrated circuits CB4024A. The outputs of the binary counter 22' are supplied as inputs to an array of 5 latching circuits consisting of RCA integrated circuits CB4019A forming latching network 24'. The resistors of the summing resistor network 52' are identical in value, that value herein selected to be 909 K.

What is claimed is:

1. A frequency to voltage converter for developing an analog output signal which is a logarithmic function of the frequency of input pulses, comprising,
    clock means for producing clock pulses at a constant pulse rate,
    a digital pattern generator having an input connected to said clock means and a plurality of outputs, said digital pattern generator responding to input pulses occurring at a frequency less than said clock pulses by converting the clock pulses received between successive input pulses into a digital pattern at said outputs which is representative of a predetermined geometric sequence,
    input pulse generating means connected to said digital pattern generator for producing said input pulses, and
    digital to analog converter means connected to said outputs of said digital pattern generator and responding to successive digital patterns developed in response to said input pulses by producing an analog output signal which is a logarithmic function of the frequency of said input pulses.

2. A frequency to voltage converter for developing an analog output signal which is a logarithmic function of the frequency of input pulses, comprising,
    clock means for producing clock pulses at a constant pulse rate,
    a digital pattern generator having an input connected to said clock means and a plurality of outputs, said digital pattern generator responding to input pulses occurring at a frequency less than said clock pulses by converting the clock pulses received between successive input pulses into a digital pattern at said outputs which is representative of a predetermined geometric sequence, and input pulse generating means connected to said digital pattern generator for producing said input pulses,
    said digital pattern generator including a multi-stage ripple counter means having said clock pulses as a first input and said input pulses as a second input, said multi-stage ripple counter means having a plurality of outputs and producing a geometric sequence of signals at said outputs in response to clock pulses received between input pulses, and a latching circuit means connected to each output of said multi-stage ripple counter means, each latching circuit means producing a change in output voltage from a first level to a second level in response to an output signal from the corresponding output of said multi-stage counter means, the output voltage levels of said latching circuit means producing said digital pattern.

3. A frequency to voltage converter as claimed in claim 2 wherein said digital to analog converter includes a summing resistor network operatively connected to said latching circuit means.

4. A frequency to voltage converter means as claimed in claim 2 wherein said multi-stage ripple counter means is an *n* bit binary ripple counter.

5. A frequency to voltage converter means as claimed in claim 2 wherein said analog voltage signal is represented as:

$$V_{out} = k \log (f_{in}/f_{ref}),$$

where $V_{out}$ is the analog output signal, $f_{in}$ is the frequency of the input pulses, and $f_{ref}$ is the frequency of the clock pulses divided by the number of stages in the multi-stage ripple counter means.

6. A frequency to voltage converter as claimed in claim 2 wherein said input pulse functions to reset both said multi-stage ripple counter means and said latching circuit means.

7. A frequency to voltage converter claimed in claim 2 further including a digital to analog converter means connected to the outputs of said latching circuit means and responding to successive digital patterns developed in response to said input pulses by producing an analog output signal which is a logarithmic function of the frequency of said input pulses.

8. A frequency to voltage converter for developing an analog output signal which is a logarithmic function of the frequency of input pulses, comprising, clock means for producing clock pulses at a constant pulse rate, a digital pattern generator having an input connected to said clock means and a plurality of outputs, said digital pattern generator responding to input pulses occurring at a frequency less than said clock pulses by converting the clock pulses received between successive input pulses into a digital pattern at said outputs which is representative of a predetermined geometric sequence, an converter for developing an analog output signal which is a logarithmic function of the frequency of input pulses, comprising, clock means for producing clock pulses at a constant pulse rate, a digital pattern generator having an input connected to said clock means and a plurality of outputs, said digital pattern generator responding to input pulses occurring at a frequency less than said clock pulses by converting the clock pulses received between successive input pulses into a digital pattern at said outputs which is representative of a predetermined geometric sequence, and input pulse generating means connected to said digital pattern generator for producing said input pulses, said digital pattern generator including a multi-stage ripple counter means having said clock pulses as a first input and said input pulses as a second input, said multi-stage ripple counter means having a plurality of outputs and producing a geometric sequence of signals at said outputs in response to clock pulses received between input pulses, and a latching circuit means connected to each output of said multi-stage ripple counter means, each latching circuit means producing a change in output voltage from a first level to a second level in response to an output signal from the corresponding output of said multi-stage counter means, the output voltage input pulses generating means connected to said digital pattern generator for producing said input pulses, said digital pattern generator including a multi-stage ripple counter means having clock pulses as a first input and input pulses as a second input, said multi-stage ripple counter means having a plurality of outputs and producing a geometric sequence of signals at said outputs in response to clock pulses received between input pulses.

* * * * *